United States Patent

Alice et al.

(10) Patent No.: US 6,816,751 B1
(45) Date of Patent: Nov. 9, 2004

(54) MATERIAL INLINE QUALITY MANAGEMENT SYSTEM

(75) Inventors: Nyuk Fah Lee Alice, Singapore (SG); SeonPeng Au, Singapore (SG)

(73) Assignee: Seagate Technology LLC, Scotts Valley, CA (US)

(*) Notice: Subject to any disclaimer, the term of this patent is extended or adjusted under 35 U.S.C. 154(b) by 724 days.

(21) Appl. No.: 09/716,702

(22) Filed: Nov. 20, 2000

Related U.S. Application Data

(60) Provisional application No. 60/180,611, filed on Feb. 7, 2000.

(51) Int. Cl.[7] .............................................. G06F 17/00
(52) U.S. Cl. ...................................... 700/222; 700/109
(58) Field of Search ............................ 700/95, 96, 100, 700/101, 102, 109, 110, 116, 117, 121, 215, 219, 221, 222

(56) References Cited

U.S. PATENT DOCUMENTS

| | | | |
|---|---|---|---|
| 4,827,423 A | 5/1989 | Beasley et al. ............... 700/96 |
| 5,321,605 A | 6/1994 | Chapman et al. .............. 705/7 |
| 5,442,545 A | * 8/1995 | Matsui et al. .................. 705/29 |
| 5,469,498 A | * 11/1995 | Abe et al. .............. 379/127.01 |
| 5,831,859 A | 11/1998 | Medeiros et al. ........... 700/218 |
| 5,903,457 A | 5/1999 | Chang .......................... 700/95 |
| 5,943,484 A | 8/1999 | Milne et al. ................. 700/100 |
| RE36,360 E | 10/1999 | Costanza ....................... 705/8 |
| 6,041,267 A | 3/2000 | Dangat et al. .............. 700/107 |
| 6,332,536 B2 | * 12/2001 | Easton ..................... 206/459.5 |
| 6,507,765 B1 | * 1/2003 | Hopkins et al. .............. 700/95 |

* cited by examiner

*Primary Examiner*—Albert W. Paladini
*Assistant Examiner*—Chad Rapp
(74) *Attorney, Agent, or Firm*—Jennifer M. Buenzou

(57) ABSTRACT

Systems and methods are provided through which printed circuit board assemblies (PCBAs) that share components that have a high rate of failure are identified. The components are substantially similar components, such as components that are embodied on a reel and/or components that were manufactured by the same manufacturer. The identification (ID) of substantially similar components are captured, such as by scanning a barcode ID of the substantially similar components, an ID of each printed circuit board assembly (PCBA) is captured, such as by scanning a barcode ID of each PCBA. Later, an association between the ID of each PCBA and the ID of the substantially similar components is determined. PCBAs that share components that have a high rate of failure are identified from the association. The association is used to identify PCBAs that are at risk for sharing common failures.

19 Claims, 8 Drawing Sheets

MATERIAL INLINE QUALITY MANAGEMENT SYSTEM

RELATED APPLICATION

This application claims the benefit of U.S. Provisional Application Ser. No. 60/180,611, filed Feb. 7, 2000 under 35 U.S.C. 119(e).

FIELD OF THE INVENTION

This invention relates generally to production lines, and more particularly to production lines for printed circuit board assemblies.

BACKGROUND OF THE INVENTION

Conventionally, human resources are used to record information on raw material for a typical factory operation. The information gathered includes verification records, comparison of raw material and/or component type with bills of material, and comparison of inventory records of the raw material and/or components to consumption. These verification tasks are tedious and error-prone. However, this task is essential to provide the traceability of a product and efficient factory operation, which is particularly necessary in the production of medical devices and computer mass storage devices. In regard to products that are composed of more than 100 types of components and/or raw materials, the verification task is usually impossible to perform without extraordinary time and/or expense. There is a need for more efficient verification of component usage in production of finished goods.

FIG. 1 is a block diagram of a conventional production line 100 or assembly line for printed circuit board assemblies (PCBAs) 140. PCBAs are used in computers, communications equipment, televisions, and many other products. In a typical PCBA, many electrical components are attached to the top and bottom surfaces of a printed circuit board (PCB).

The production line 100 includes one or more pick-and-place (P&P) machines 110 that place components on a PCB 150. The two forms of P&P machines are "chip shooters" that place discrete components on a printed circuit board, and "IC placers" that place integrated circuits on a printed circuit board. The P&P machines 110 are automated machines that use a loading list as a guide indicating the placement of components on PCB 150 to produce a PCBA 140. The loading list identifies components and the locations of the components on a particular PCBA design. Each P&P machine 110 has one or more feeders 120, into which a group of components 130 enter the P&P machine 110 for placement on a PCB 150. Commonly, the group of components 130 is grouped on a reel and/or tray in which the components are attached in series, and as the reel and/or tray 130 is consumed by the P&P machine 110 during the placement of components, each component is detached in sequence from the reel and/or tray 130. One component is detached for each location on the PCB 150 that passes through the P&P machine 110.

The production line 100 is also known as an auto placement line (APL) because the production is composed of a number of automated P&P machines 110. The production line 100 is also known as a "front-line."

Conversion is a process of changing from one revision of a PCBA product to another revision of a PCBA product in a P&P machine 110. During conversion, the loading list from the first revision is replaced with the loading list of the second revision. Conversion requires the operator to manually determine which of the partially-consumed reels and/or trays of the first revision can be reused in the second revision, how the reels and/or trays need to be rearranged, and which reels and/or trays need to be replaced.

Failures on a PCBA occur in one particular component on the PCBA. Often, components in the same production lot, or supplied by the same vendor, or assembled in PCBAs on the same day have similar rates of reliability. Therefore, identifying PCBAs that have components that share a production lot of a vendor assists in performing recalls of PCBAs that have a high probability of failure. In the determination of the quality of PCBAs and in determining recalls of PCBAs, conventional systems, such as conventional production line 100, provide no traceability of all PCBAs that have a component with a high, excessive and/or unacceptable rate of failure. More specifically, a manual quality control group will determine that components from a particular manufacturer, or from a particular reel and/or tray, have a high failure rate. Conventional systems provide no automated ability to trace all PCBAs that share components from the same manufacturer or the same reel and/or tray, making precise recalls of all affected PCBAS, and only the affected PCBAs, practically impossible.

For the reasons stated above, and for other reasons stated below which will become apparent to those skilled in the art upon reading and understanding the present specification, there is a need in the art for automated tracing of PCBAs that have components from the same group of components, or come from a manufacturer, that has a high failure rate.

SUMMARY OF THE INVENTION

The above-mentioned shortcomings, disadvantages and problems are addressed by the present invention, which will be understood by reading and studying the following specification.

The present invention provides component level and board level traceability to a PCBA manufacturing operation.

In one aspect of the invention, a manufacturing production line includes one or more pick-and-place (P&P) machines that place components on a printed circuit board. Each P&P machine has a number of feeders through which a reel and/or tray of components enter the P&P machine for placement on a PCB. Each reel and/or tray has a bar coded label that uniquely identifies the reel and/or tray. A line client is coupled to an identification (ID) capturer, such as a hand-held bar-code scanner. The bar-code ID on the bar-code label on the reel and/or tray is captured or scanned by the capturer, and transmitted to the line client. The line client communicates the ID to a server. As each PCBA is produced by the production line, a fixed scan station (FSS) captures the ID of each PBCA, such as through a fixed mount bar code scanner, that is coupled to the FSS. A server records the ID of each PCBA during production, and the ID of each group of substantially similar components. Thereafter, the server will use the recorded IDs of the reels and/or trays and PCBAs to trace failed components from one PCBA to the other PCBAs that share a common problem, such as a component, manufacturer, or date of production of the component and/or the PCBA. To trace PCBAs with a common problem, the ID of the PCBA and the failed component are received, after which the IDs of other PCBAs that have a component from the same reel and/or tray as the failed component are determined from the record IDs. The IDs of the other PCBAs are reported to an organization that that has had possession of the other PCBAs, so that the organization may take appropriate action, such as returning the PCBAs to the PCBA manufacturer.

The present invention provides efficient verification of component usage in production of finished goods. More specifically, the present invention enables PCBAs that have components that share a substantial similarity to identified. Identifying the PCBAs is particularly useful when performing recalls of PCBAs that have a high probability of failure.

The present invention describes systems, clients, servers, methods, and computer-readable media of varying scope. In addition to the aspects and advantages of the present invention described in this summary, further aspects and advantages of the invention will become apparent by reference to the drawings and by reading the detailed description that follows.

DETAILED DESCRIPTION OF THE INVENTION

In the following detailed description of the preferred embodiments, reference is made to the accompanying drawings that form a part hereof, and in which are shown by way of illustration specific embodiments in which the invention may be practiced. It is to be understood that other embodiments may be utilized and structural changes may be made without departing from the scope of the present invention.

The detailed description is divided into five sections. In the first section, the hardware and the operating environment in conjunction with which embodiments of the invention may be practiced are described. In the second section, a system level overview of the invention is presented. In the third section, methods for an embodiment of the invention are provided. In the fourth section, a particular object-oriented Internet-based implementation of the invention is described. Finally, in the fifth section, a conclusion of the detailed description is provided.

Hardware and Operating Environment

Figure 2:
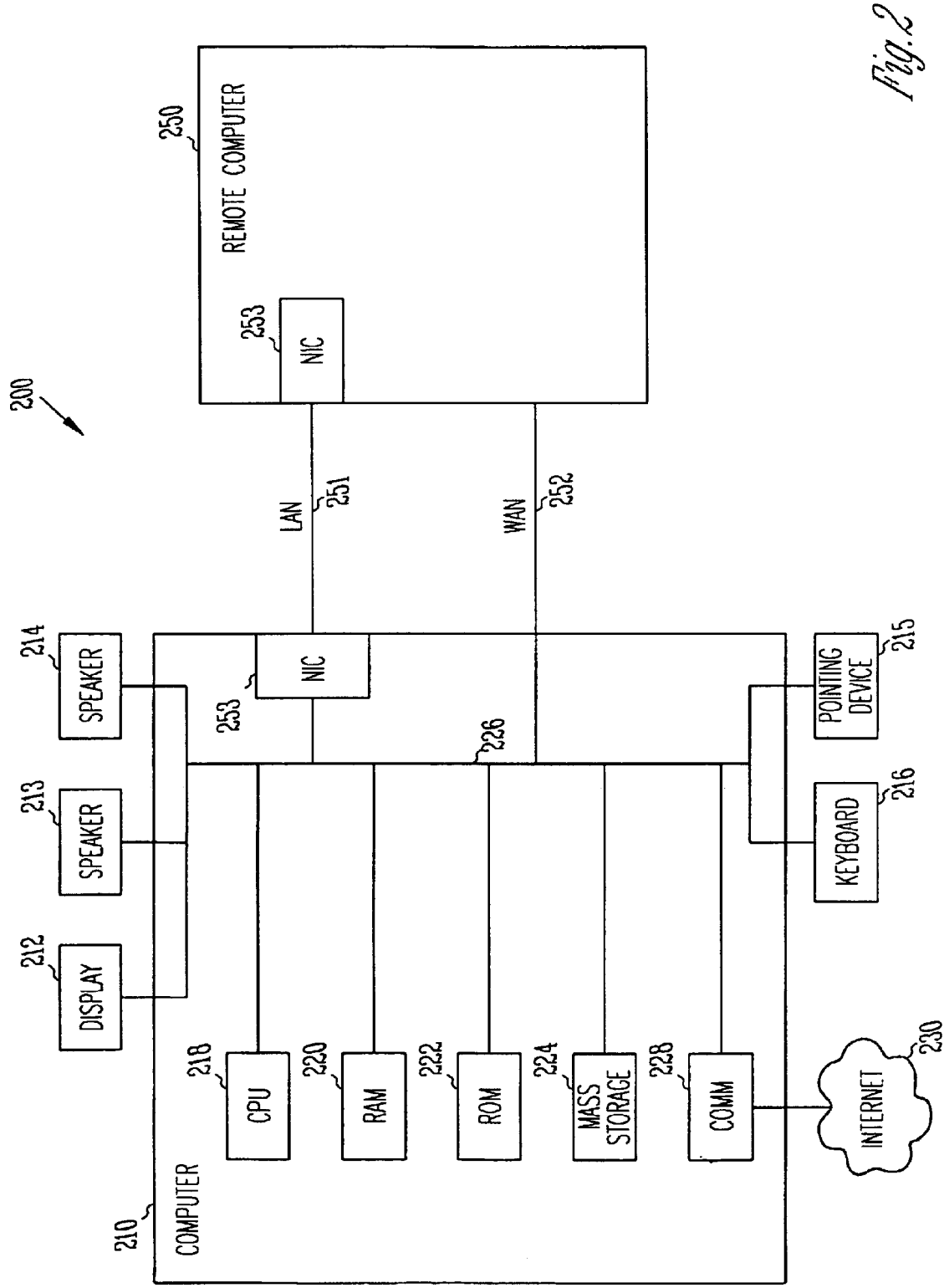
FIG. 2 is a block diagram of the hardware and operating environment in which different embodiments of the invention can be practiced.

FIG. 2 is a block diagram of the hardware and operating environment 200 in which different embodiments of the invention can be practiced. The description of FIG. 2 provides an overview of computer hardware and a suitable computing environment in conjunction with which some embodiments of the present invention can be implemented. Embodiments of the present invention are described in terms of a computer executing computer-executable instructions. However, some embodiments of the present invention can be implemented entirely in computer hardware in which the computer-executable instructions are implemented in read-only memory. One embodiment of the invention can also be implemented in client/server computing environments where remote devices that are linked through a communications network perform tasks. Program modules can be located in both local and remote memory storage devices in a distributed computing environment.

Computer 210 is operatively coupled to display device 212, pointing device 215, and keyboard 216. Computer 210 includes a processor 218, commercially available from Intel, Motorola, Cyrix and others, random-access memory (RAM) 220, read-only memory (ROM) 222, and one or more mass storage devices 224, and a system bus 226, that operatively couples various system components including the system memory to the processing unit 218. Mass storage devices 224 are more specifically types of nonvolatile storage media and can include a hard disk drive, a floppy disk drive, an optical disk drive, and a tape cartridge drive. The memory 220, 222, and mass storage devices, 224, are types of computer-readable media. A user enters commands and information into the computer 210 through input devices such as a pointing device 215 and a keyboard 216. Other input devices (not shown) can include a microphone, joystick, game pad, satellite dish, scanner, or the like. The processor 218 executes computer programs stored on the computer-readable media. Embodiments of the present invention are not limited to any type of computer 210. In varying embodiments, computer 210 comprises a PC-compatible computer, a MacOS-compatible computer or a UNIX-compatible computer. The construction and operation of such computers are well known within the art.

Furthermore, computer 210 can be communicatively connected to the Internet 230 via a communication device 228. Internet 230 connectivity is well known within the art. In one embodiment, a communication device 228 is a modem that responds to communication drivers to connect to the Internet via what is known in the art as a "dial-up connection." In another embodiment, a communication device 228 is an Ethernet or similar hardware (network) card connected to a local-area network (LAN) that itself is connected to the Internet via what is known in the art as a "direct connection" (e.g., T1 line, etc.).

Computer 210 can be operated using at least one operating environment to provide a graphical user interface including a user-controllable pointer. Such operating environments include operating systems such as versions of the Microsoft Windows and Apple MacOS operating systems well-known in the art. Embodiments of the present invention are not limited to any particular operating environment, however, and the construction and use of such operating environments are well known within the art. Computer 210 can have at least one web browser application program executing within at least one operating environment, to permit users of computer 210 to access intranet or Internet world-wide-web pages as addressed by Universal Resource Locator (URL)

addresses. Such browser application programs include Netscape Navigator and Microsoft Internet Explorer.

Display device 212 permits the display of information, including computer, video and other information, for viewing by a user of the computer. Embodiments of the present invention are not limited to any particular display device 212. Such display devices include cathode ray tube (CRT) displays (monitors), as well as flat panel displays such as liquid crystal displays (LCD's). Display device 212 is connected to the system bus 226. In addition to a monitor, computers typically include other peripheral input/output devices such as printers (not shown), speakers, pointing devices and a keyboard. Speakers 213 and 214 enable the audio output of signals. Speakers 213 and 214 are also connected to the system bus 226. Pointing device 215 permits the control of the screen pointer provided by the graphical user interface (GUI) of operating systems such as versions of Microsoft Windows. Embodiments of the present invention are not limited to any particular pointing device 215. Such pointing devices include mice, touch pads, trackballs, remote controls and point sticks. Finally, keyboard 216 permits entry of textual information into computer 210, as known within the art, and embodiments of the present invention are not limited to any particular type of keyboard.

The computer 210 can operate in a networked environment using logical connections to one or more remote computers, such as remote computer 250. These logical connections are achieved by a communication device coupled to, or a part of, the computer 210. Embodiments of the present invention are not limited to a particular type of communications device. The remote computer 250 can be another computer, a server, a router, a network PC, a client, a peer device or other common network node. The logical connections depicted in FIG. 2 include a local-area network (LAN) 251 and a wide-area network (WAN) 252. Such networking environments are commonplace in offices, enterprise-wide computer networks, intranets and the Internet.

When used in a LAN-networking environment, the computer 210 and remote computer 250 are connected to the local network 251 through a network interface or adapter 253, which is one type of communications device. When used in a conventional WAN-networking environment, the computer 210 and remote computer 250 communicate with a WAN 252 through modems (not shown). The modem, which can be internal or external, is connected to the system bus 226. In a networked environment, program modules depicted relative to the computer 210, or portions thereof, can be stored in the remote memory storage device.

System Level Overview

Figure 3:
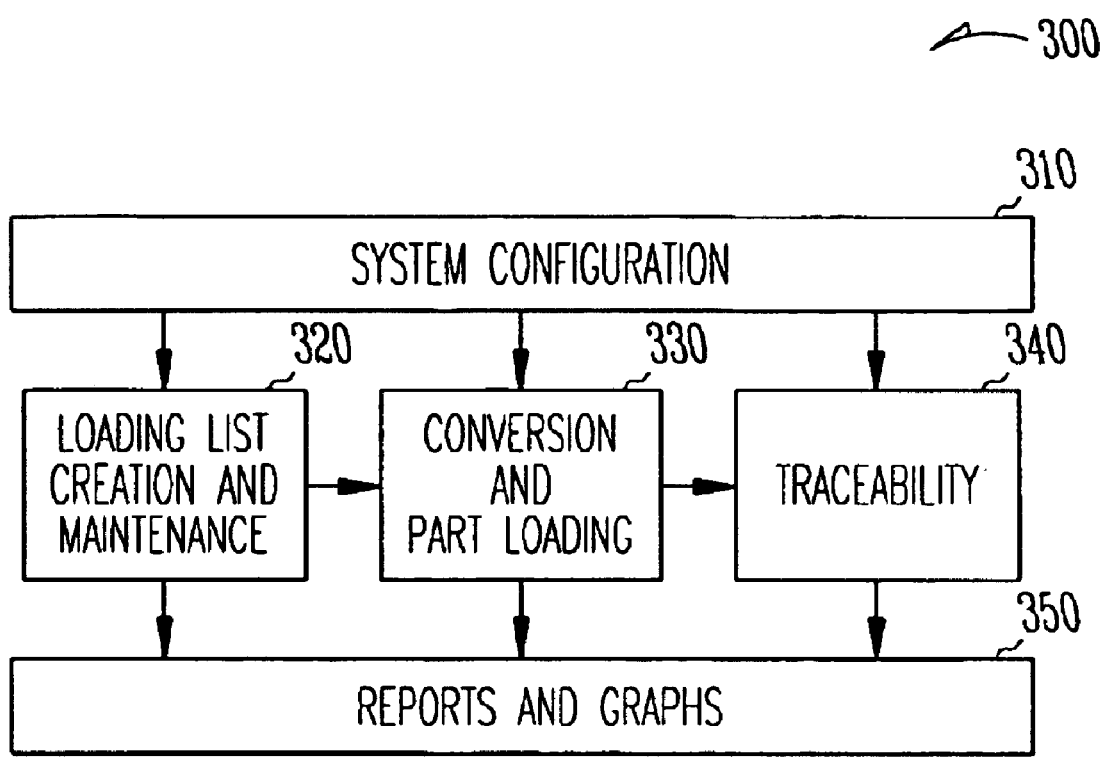
FIG. 3 is a diagram illustrating a system-level overview of an embodiment of the invention.

FIG. 3 is a block diagram that provides a system level overview 300 of the operation of embodiments of the present invention. Embodiments of the invention operate in a multi-processing, multi-threaded operating environment on a computer, such as computer 210 in FIG. 2.

Figure 1:
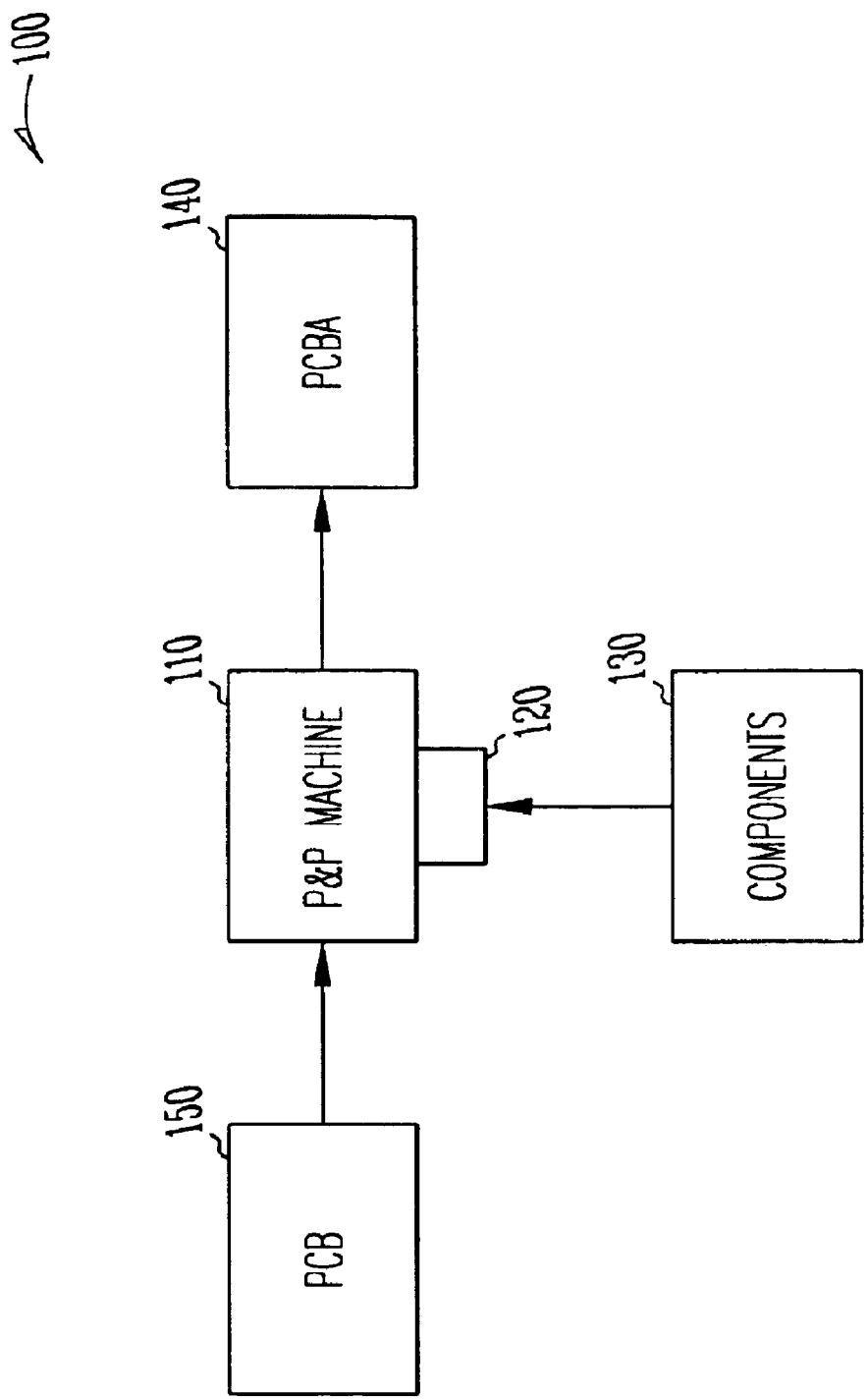
FIG. 1 is a block diagram of a conventional production line or assembly line for printed circuit board assemblies.

System 300 includes a system configuration 310, of a production line, such as a production line 100 in FIG. 1, for printed circuit board assemblies (PCBAs). System configuration information is communicated to a component that performs loading list creation and maintenance 320. The loading list describes components, such as components 130 in FIG. 1. The component that performs loading list creation and maintenance 320 communicates loading list information to a component that performs conversion and part loading 330. The component that performs conversion and part loading 330 also receives system configuration information 310. A component that performs traceability 340 receives system configuration information from the system configuration 310 and conversion and part loading information from the component that performs conversion and part loading. The component that performs traceability 340 also produces reports of traceability information. System 300 performs automated traceability, and thus efficient verification of component usage in production of finished goods. In the example of production of PCBAs, the system provides an ability to trace all PCBAs that share components from the same manufacturer or the same defective reel and/or tray, thus enabling recalls of all affected PCBAs, and only PCBAs that share components from the same manufacturer or the same defective reel and/or tray. The component that performs loading list creation and maintenance 320, the component that performs conversion and part loading 330, and/or the component that performs traceability 340, produce reports pertinent to the functions of the components 350.

The system 300 provides efficient verification of component usage in production of finished goods. More specifically, the system 300 enables PCBAs that have components that share a substantial similarity to identified, and the identification to be communicated to interested parties. Identifying the PCBAs is particularly useful when performing recalls of PCBAs that have a high probability of failure.

Methods of an Embodiment of the Invention

In the previous section, a system level overview of the operation of an embodiment of the invention was described. In this section, the particular methods performed by the server and the clients of such an embodiment are described by reference to a series of flowcharts. Describing the methods by reference to a flowchart enables one skilled in the art to develop such programs, firmware, or hardware, including such instructions to carry out the methods on suitable computerized clients (the processor of the clients executing the instructions from computer-readable media). Similarly, the methods performed by the server computer programs, firmware, or hardware are also composed of computer-executable instructions. Describing the methods by reference to flowcharts enables one skilled in the art to develop programs, firmware, or hardware, including instructions to carry out the methods on a suitable computerized server (the processor of the clients executing the instructions from computer-readable media). Methods 400–500 are performed by a client program executing on, or performed by firmware or hardware that is a part of, a computer, such as computer 210 in FIG. 2.

Figure 4:
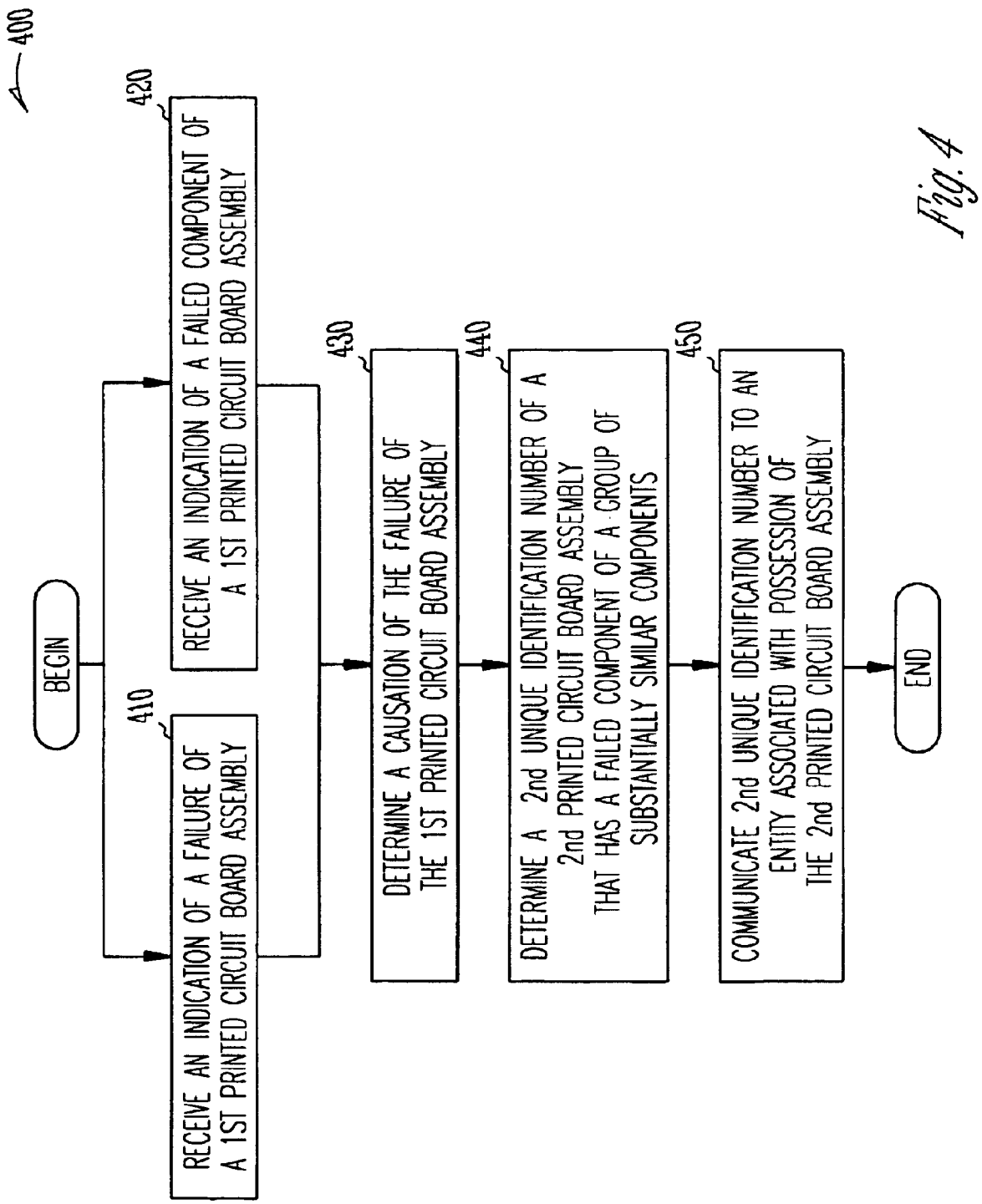
FIG. 4 is a flowchart of a method for tracing the association of components consumed in production of printed circuit board assemblies according to an embodiment of the invention.

FIG. 4 is a flowchart of a method 400 for tracing the association of components consumed in production of printed circuit board assemblies performed by a client according to an embodiment of the invention.

In one aspect of the invention, a method includes receiving an indication of a failure of a first printed circuit board assembly (PCBA) 410. The first PCBA has a first unique identification number (ID), such as a serial number. The method also includes receiving an indication of a failed component of the first PCBA 420. The failed component is a member of a group or plurality of substantially similar components that were used in the manufacture of a group of printed circuit board assemblies. In one example, the plurality of substantially similar components includes a reel and/or tray of components. In varying embodiments, receiving the PCBA ID in step 410 is performed before, during and/or after receiving an indication of a failure 420.

Thereafter, a causation of the failure of the first PCBA is determined 430. In one example, the causation in the determining step 430 is associated with a source, in which the source is a vendor of the failed component or a manufacturer of the failed component. In another example, the causation is a process of manufacturing the PCBA.

Later, another assembly that shares a component with the first assembly is identified, by determining a second unique ID of a second PCBA that includes a failed component of the plurality of substantially similar components 440. In one example, the determining step includes determining a group of unique IDs of the members of a group of PCBAs, other than the failed PCBA, that include a failed component of the group of substantially similar components.

Thereafter, the second unique ID is communicated to an entity associated with possession of the second PCBA 450. In one example, communicating 450 includes communicating the group of unique IDs to at least one entity associated with possession of the second PCBA. In another example of the communicating 450, an entity associated with possession includes a downstream member of a marketing and/or distribution channel. In yet another example of communicating 450, the communication is implemented in part through the reports pertinent to the functions of the components 350 in FIG. 3.

Method 400 provides efficient verification of component usage in production of finished goods. More specifically, the system 300 enables PCBAs that have components that share a substantial similarity to identified, and the identification to be communicated to interested entities. Identifying the PCBAs is particularly useful when performing recalls of PCBAs that have a high probability of failure.

Figure 5:
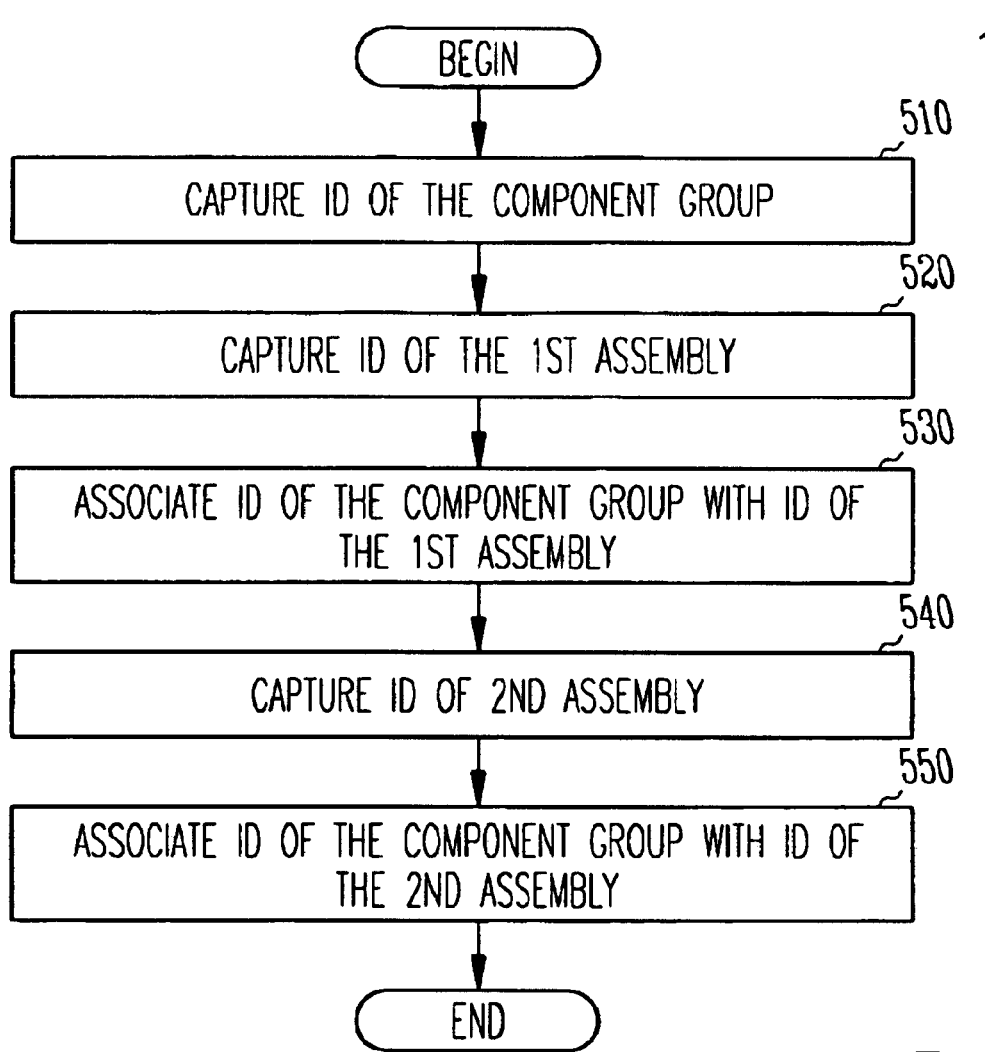
FIG. 5 is a flowchart of a method for tracing the association of components consumed in production of printed circuit board assemblies, the method performed in addition to the method of FIG. 4, or as an independent method, according to an embodiment of the invention.

FIG. 5 is a flowchart of a method 500 of steps for tracing the association of components consumed in production of printed circuit board assemblies, the method performed in addition to the steps of method 400, or as an independent method, by a client according to an embodiment of the invention.

The method includes the step of capturing an ID of the group of substantially similar components 510. In one example, the capturing step includes scanning. In another example, the group of substantially similar components is a reel and/or tray of components with a bar-code label. In a further example, the capturing step 510 includes scanning a bar-code label on a reel and/or tray of components. In yet another example, the ID of the group of substantially similar components includes a trace code, a lot code, and a vendor of the group of substantially similar components; a production date, a date after which the PCBA ID is produced, and a date before which the PCBA ID is produced. Thereafter, the first unique ID number of the first PCBA is captured 520. In varying embodiments, the capturing step 510 is performed before, during, and/or after the capturing step 520. Then, the ID of the group of substantially similar components is associated with the first unique ID of the first PCBA 530. The method also includes capturing the second unique ID of the second PCBA 540 and associating the ID of the group of substantially similar components with the second unique ID of the second PCBA 550. Capturing step 520 is performed during a production of the first PCBA and the capturing step 540 is performed during a production of the second PCBA. In varying embodiments, the associating step 530 is performed during or after production of the first PCBA and associating step 550 is performed during or after production of the second PCBA.

Client-server Based Implementation

Figure 6:
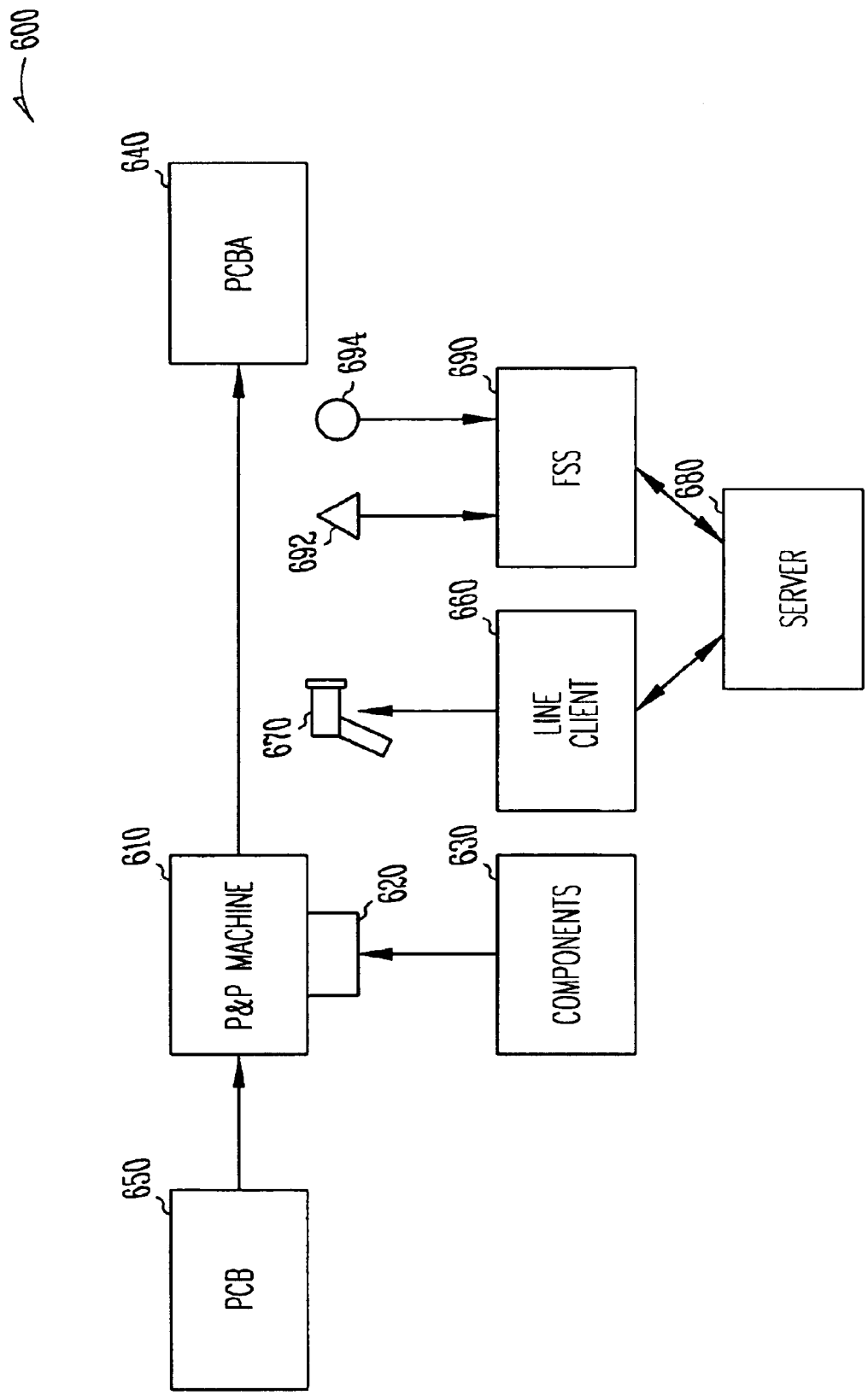
FIG. 6 is a block diagram of an apparatus in a manufacturing environment for tracing the association of components consumed in production of printed circuit board assemblies according to an embodiment of the invention.
Figure 7:
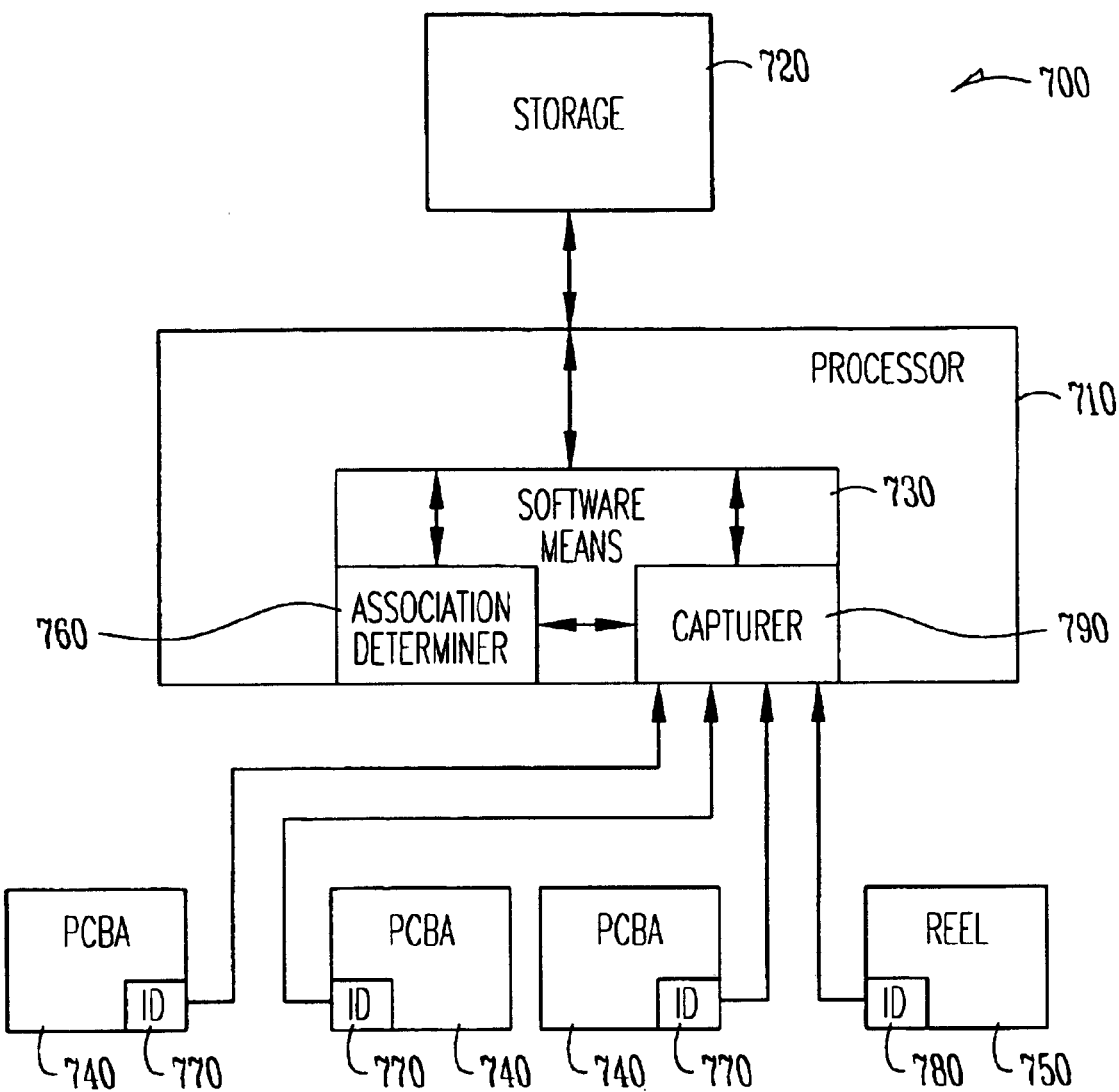
FIG. 7 is a block diagram of an apparatus for tracing the association of ebb components consumed in production of printed circuit board assemblies according to an embodiment of the invention.
Figure 8:
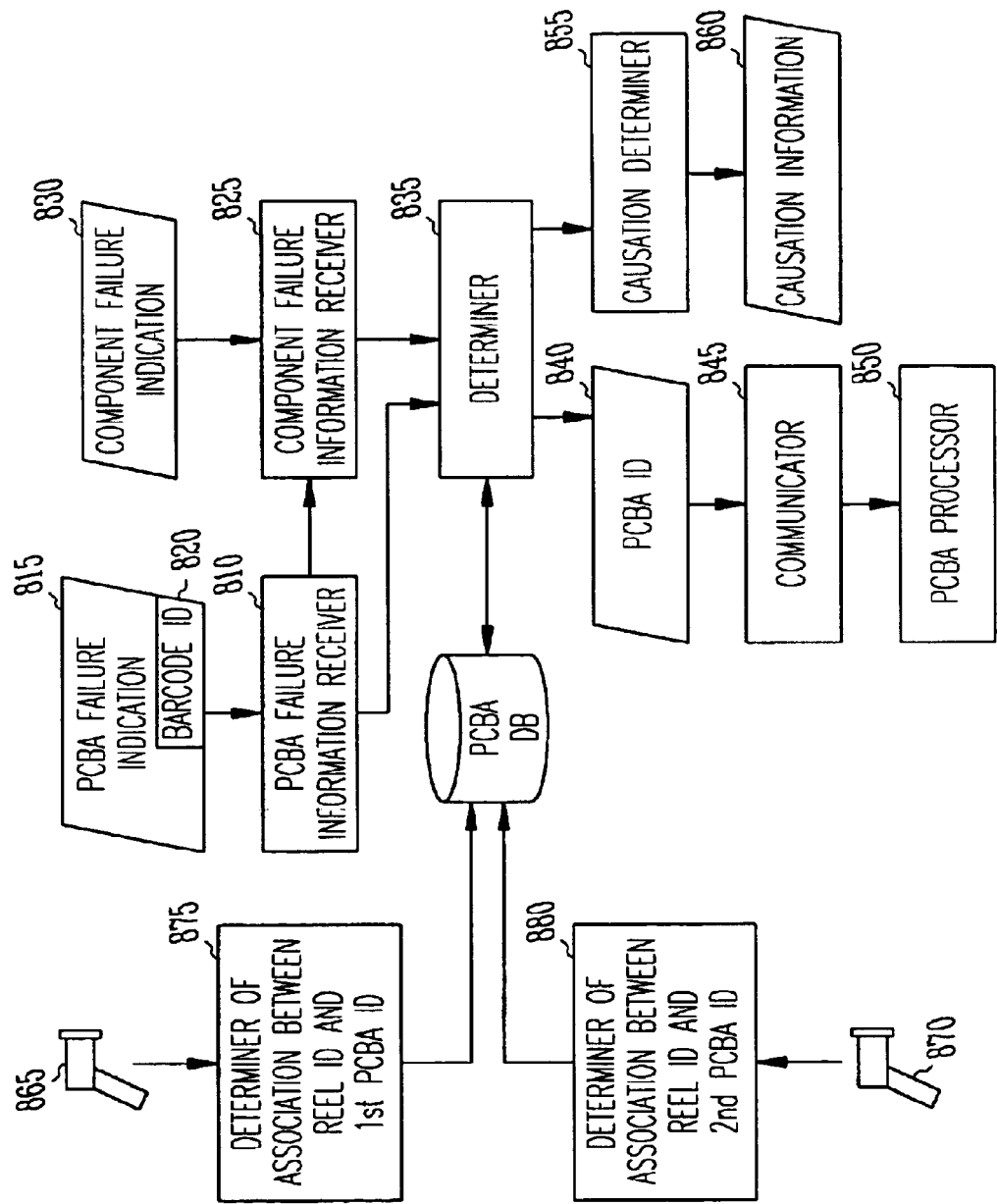
FIG. 8 is a block diagram of an apparatus for tracing the association of components consumed in production of printed circuit board assemblies according to an embodiment of the invention.

Referring to FIGS. 6–8, a particular implementation of the invention is described in conjunction with the system overview in FIG. 3 and the methods described in conjunction with FIGS. 4 and 5.

FIG. 6 is a block diagram of apparatus 600 for tracing the association of components consumed in production of printed circuit board assemblies (PCBAs) according to an embodiment of the invention.

The production line 600 includes one or more pick-and-place (P&P) machines 610, such as P&P machine 110 in FIG. 1, that place components on a PCB 650, such as PCB 150 in FIG. 1. Each P&P machine 610 has one or more feeders 620, such as feeder 120 in FIG. 1, into which a group of components 630, such as components 130 in FIG. 1, such as a reel and/or tray, enter the P&P machine 610 for placement on a PCB 650. Each reel and/or tray 630 has a bar coded label that uniquely identifies the reel and/or tray.

The production line 600 includes a line client 660, operably coupled to an identification capturer 670, such as a hand-held bar-code scanner 670. The identification, such as a bar-code, of substantially similar components, such as a reel and/or tray of components, is captured by the identification capturer 670 and communicated to the line client 660. Capturing the identification is described in step 510 in FIG. 5. In varying embodiments, the production line 600 will have one line client 660 and one identification capturer 670 for the entire production line 600, one line client 660 and one identification capturer 670 for each P&P machine 110, or one line client 660 and one identification capturer 670 for a subset of P&P machines 110 in the production line. The line client 660 communicates the identification to a server 680.

As each PCBA 140 is produced by the production line 600, the fixed scan station (FSS) 690 captures the identification of each PCBA 140, such as through a fixed mount bar code scanner 692, that is operably coupled to the FSS 690. Capturing the identification of each PCBA is described in step 520 of FIG. 5. In one example, the sensor 694 will determine or sense when a PCBA 140 is transporting, nearby the fixed mount bar code scanner 692, which will prompt the FSS 690 to activate the fixed mount bar code scanner 692 and capture the ID of the PCBA.

The server 680 records the identification of each PCBA 140 during production, and the identification of each group of substantially similar components. The server 680 performs method 400 of FIG. 4 and/or the associating step of 550 of method 500 of FIG. 5. In one example, server 680 is implemented as computer 210 in FIG. 2.

FIG. 7 is a block diagram of apparatus 700 for tracing the association of components consumed in production of printed circuit board assemblies (PCBAs) according to an embodiment of the invention.

Apparatus 700 includes a processor 710, such as processor 218 in FIG. 2, a storage device 720, such as storage devices 224 in FIG. 2, coupled to the processor 710 and a software means 730 operative on the processor for tracing the association of a plurality of printed circuit board assemblies 740. The association is through a group of substantially similar components embodied on a reel and/or tray 750. The plurality of printed circuit board assemblies 740 share a group of substantially similar components that are consumed in production and/or assembly of the plurality of printed circuit board assemblies 740. The software means includes a determiner 760 that determines printed circuit boards that are associated to each other. The association is determined from a bar-coded identification code 770, such as a bar code label, on each of the plurality of printed circuit board assemblies 740 and from the bar-coded identification code 780 on the group of substantially similar components embodied on the reel and/or tray 750. The bar-coded identification code 770 on each of the plurality of printed circuit board assemblies 740 is scanned and stored in the storage device 720 by a capturer 790. The bar-coded identification code 780 on the group of substantially similar components embodied on a reel and/or tray 750 is scanned and stored in the storage device 720. In one example, processor 710 and storage device 720 are implemented in server 680 in FIG. 6.

FIG. 8 is a block diagram of apparatus 800 for tracing the association of components consumed in production of printed circuit board assemblies, according to an embodiment of the invention.

Apparatus 800 includes a receiver 810 of an indication of a failure 815 of a first PCBA. The indication of a failure 815 is in electronic form, but also may have been originally received in a physical document that was transcribed or scanned into electronic format. The first PCBA has a unique bar-coded ID number 820 that is included in the indication of failure 815 that indicates the ID of the PCBA that failed.

Apparatus 800 also includes another receiver 825 of an indication of a failed component 830 of the PCBA. In one embodiment, the indication of a failed component 830 includes an ID of the component on a PCBA. In one embodiment, receiver 825 is operably coupled to the first receiver 810 in order to coordinate the receipt of indication 815 and 830. In another embodiment, indication of a failure 815 and the indication of a failed component 830 are encoded in one singular electronic message, and received 810 and 825 are implemented as a singular receiver. The failed component is a member of a plurality of substantially similar components, such as a reel and/or tray of components, that were used in the manufacture of a plurality of PCBAs.

Apparatus 800 also includes a determiner 835 of another unique bar-coded ID number 840 of a second PCBA. The second PCBA includes a failed component of, or from, the plurality of substantially similar components. The determiner 835 cross-references the indication of a failure 815 and the PCBA ID 820, the indication of a failed PCBA component 830, and a database (DB) 842 of manufactured PCBAs. The manufactured PCBA database (DB) 842 stores information including the ID of PCBAs and the ID of the plurality of substantially similar components that were used in the manufacture of the PCBAs. In one embodiment, a second determiner (not shown) determines a plurality of unique bar-coded ID numbers of the members of the plurality of PCBAs, other than the failed PCBA, that comprises a failed component of the plurality of substantially similar components. The determiner 835 is operably coupled to receiver 825.

Apparatus 800 also includes a communicator 845 of the second unique bar-coded ID number 840 to an entity 850 associated with possession of the second PCBA. One example of an entity 850 is a downstream member of a marketing channel. More specifically, a downstream member of a marketing channel is a distributor, wholesaler, A retailer, systems integrator, computer manufacturer, or an end-user organization. The communicator 845 is operably coupled to the determiner 835. In one embodiment, communicator 845 includes a component that communicates the plurality of unique bar-coded ID numbers to at least one entity associated with possession of the second PCBA.

In another embodiment, apparatus 800 also includes a determiner 855 of a cause 860 of the failure of the first PCBA. The causation 860 is associated with a source that is among the following: a vendor of the failed component, a manufacturer of the failed component, and a type, method and/or process of manufacturing the PCBA. The second determiner 855 is operably coupled to the first determiner 835.

In varying embodiments, apparatus 800 includes a first capturer 865 of a bar-coded ID of the plurality of substantially similar components (such as a bar-code scanner), a second capturer 870 (such as a bar-code scanner) of the first unique bar-coded ID number of the first PCBA and the second unique bar-coded ID number of the second PCBA, a determiner 875 of an association of the bar-coded ID of the plurality of substantially similar components with the first unique bar-coded ID number of the first PCBA, and/or a determiner 880 of the bar-coded ID of the plurality of substantially similar components with the second unique bar-coded ID number of the second PCBA. In another embodiment, the bar-coded ID of the plurality of substantially similar components further comprises a trace code of the plurality of substantially similar components, a lot code of the plurality of substantially similar components, a vendor of the plurality of substantially similar components, a production date, a date after which the PCBA bar-coded ID is produced, and a date before which the PCBA bar-coded ID is produced.

In another embodiment, a database management system (DBMS) is operably coupled between DB 842 and determiner 875 and between DB 842 and determiner 880.

The apparatus 800 components of the receiver 810, receiver 825, determiner 835, determiner 855, determiner 875, and the determiner 880 can be embodied as computer hardware circuitry or as a computer-readable program, or a combination of both. The apparatus 800 components of the receiver 810, receiver 825, determiner 835, determiner 855, determiner 875, and the determiner 880 may also be implemented on server 680 in FIG. 6.

More specifically, in the computer-readable program embodiment, the programs can be structured in an object-orientation using an object-oriented language such as Java, Smalltalk or C++, and the programs can be structured in a procedural-orientation using a procedural language such as COBOL or C. The software components communicate in any of a number of means that are well-known to those skilled in the art, such as application program interfaces (A.P.I.) or interprocess communication techniques such as remote procedure call (R.P.C.), common object request broker architecture (CORBA), Component Object Model (COM), Distributed Component Object Model (DCOM), Distributed System Object Model (DSOM) and Remote Method Invocation (RM). The components execute on as few as one computer as in computer 510 in FIG. 5, or on at least as many computers as there are components.

The apparatus 800 provides efficient verification of component usage in production of finished goods. More specifically, the system 300 enables PCBAs that have components that share a substantial similarity to identified, and the identification to be communicated to interested entities. Identifying the PCBAs is particularly useful when performing recalls of PCBAs that have a high probability of failure.

Conclusion

In conclusion, systems and methods are disclosed through which printed circuit board assemblies (PCBAs) that share components that have a high rate of failure are identified. The components are substantially similar components, such as components that are embodied on a reel and/or tray and/or components that were manufactured by the same manufacturer. The identification (ID) of substantially similar components are captured, such as by scanning a barcode ID of the substantially similar components, and the ID of each PCBA is captured, such as by scanning a barcode ID of each PCBA. Later, an association between the ID of each PCBA and the ID of substantially similar components is determined. PCBAs that sharecomponents that have a high rate of failure are identified from the association. The association is used to identify PCBAs that are at risk for sharing a common failure.

System 300 includes a system configuration 310, of a production line for printed circuit board assemblies (PCBAs). System configuration information is communicated to a component that performs loading list creation and maintenance 320. The component that performs loading list creation and maintenance 320 communicates loading list information to a component that performs conversion and part loading 330. The component that performs conversion and part loading 330 also receives system configuration information 310. A component that performs traceability 340 receives system configuration information from the system configuration 310 and conversion and part loading information from the component that performs conversion and part loading. The component that performs traceability 340 also produces reports of traceability information.

Also disclosed is a method that includes receiving an indication of a failure of a first printed circuit board assembly (PCBA) 410. The first PCBA has a first unique ID number, such as a serial number. The method also includes receiving an indication of a failed component of the first PCBA 420. The failed component is a member of a group or plurality of substantially similar components that were used in the manufacture of a group of printed circuit board assemblies. In one example, the plurality of substantially similar components includes a reel and/or tray of components. In varying embodiments, receiving the PCBA ID in step 410 is performed before, during and/or after receiving an indication of a failure 420. Thereafter, a causation of the failure of the first PCBA is determined 430. In one example, the causation in the determining step 430 is associated with a source, in which the source is a vendor of the failed component or a manufacturer of the failed component. In another example, the causation is a process of manufacturing the PCBA. Then another assembly that shares a component with the first assembly is identified, by determining a second unique ID of a second PCBA that includes a failed component of the plurality of substantially similar components 440. In one example, the determining step includes determining a group of unique IDs of the members of a group of PCBAs, other than the failed PCBA, that include a failed component of the group of substantially similar components. Later, the second unique ID is communicated to an entity associated with possession of the second PCBA 450. In one example, communicating 450 includes communicating the group of unique IDs to at least one entity associated with possession of the second PCBA. In another example of the communicating 450, an entity associated with possession includes a downstream member of a marketing and/or distribution channel.

Also disclosed is a method 500 also includes steps additional to method 400, of capturing an ID of the group of substantially similar components 510. In one example, the capturing step includes scanning. In another example, the group of substantially similar components is a reel and/or tray of components with a bar-code label. In a further example, the capturing step 510 includes scanning a bar-code label on a reel and/or tray of components. In yet another example, the ID of the group of substantially similar components includes a trace code, a lot code, and a vendor of the group of substantially similar components; a production date, a date after which the PCBA ID is produced, and a date before which the PCBA ID is produced. Thereafter, the first unique ID number of the first PCBA is captured 520. In varying embodiments, the capturing step 510 is performed before, during, and/or after the capturing step 520. Then, the ID of the group of substantially similar components is associated with the first unique ID of the first PCBA 530. The method also includes capturing the second unique ID of the second PCBA 540 and associating the ID of the group of substantially similar components with the second unique ID of the second PCBA 550. Capturing step 520 is performed during a production of the first PCBA and the capturing step 540 is performed during a production of the second PCBA. In varying embodiments, the associating step 530 is performed during or after production of the first PCBA and associating step 550 is performed during or after production of the second PCBA.

Also disclosed is an apparatus 600 that traces the association of components consumed in production of PCBAs. The apparatus 600 is a production line including one or more pick-and-place (P&P) machines 610 that place components on a PCB 650. Each P&P machine 610 has one or more feeders 620, into which a group of components 630, such as a reel and/or tray, enter the P&P machine 610 for placement on a PCB 650. Each reel and/or tray 630 has a bar coded label that uniquely identifies the reel and/or tray.

Apparatus 600 includes a line client 660, operably coupled to an identification capturer 670, such as a handheld bar-code scanner 670. The identification, such as a bar-code, of substantially similar components, such as a reel and/or tray of components, is captured by the identification capturer 670 and communicated to the line client 660. In varying embodiments, the apparatus 600 will have one line client 660 and one identification capturer 670 for the entire apparatus 600, one line client 660 and one identification capturer 670 for each P&P machine 110, or one line client 660 and one identification capturer 670 for a subset of P&P machines 110 in the production line. The line client 660 communicates the identification to a server 680.

As each PCBA is produced by the apparatus 600, the fixed scan station (FSS) 690 captures the identification of each PBCA, such as through a fixed mount bar code scanner 692, that is operably coupled to the FSS 690. In one example, the sensor 694 will determine or sense when a PCBA 140 is transporting, nearby the fixed mount bar code scanner 692, which will prompt the FSS 690 to activate the fixed mount bar code scanner. 692 and capture the ED of the PCBA. The server 680 records the identification of each PCBA 140 during production, and the identification of each group of substantially similar components.

Also disclosed is an apparatus 700 that includes a processor 710, a storage device 720, coupled to the processor 710 and a software means 730 operative on the processor for tracing the association of a plurality of printed circuit board assemblies 740. The association is through a group of substantially similar components embodied on a reel and/or tray 750. The plurality of printed circuit board assemblies 740 share a group of substantially similar components that are consumed in production and/or assembly of the plurality of printed circuit board assemblies 740. The software means includes a determiner 760 that determines printed circuit boards that are associated to each other. The association is determined from a bar-coded identification code 770, such as a bar code label, on each of the plurality of printed circuit board assemblies 740 and from the bar-coded identification code 780 on the group of substantially similar components embodied on the reel and/or tray 750. The bar-coded identification code 770 on each of the plurality of printed circuit board assemblies 740 is scanned and stored in the storage device 720 by a capturer 790. The bar-coded identification code 780 on the group of substantially similar components embodied on a reel and/or tray 750 is scanned and stored in the storage device 720.

An apparatus 800 is also disclosed that traces the association of components consumed in production of printed circuit board assemblies (PCBAs). Apparatus 800 includes a receiver 810 of an indication of a failure 815 of a first printed circuit board assembly (PCBA). The first PCBA has a unique bar-coded identification (ID) number 820 that is included in the indication of failure 815. Apparatus 800 also includes another receiver 825 of an indication of a failed component 830 of the PCBA. In one embodiment, the indication of a failed component 830 includes an ID of the component on a PCBA. The failed component is a member of a plurality of substantially similar components that were used in the manufacture of a plurality of PCBAs. In one embodiment, receiver 825 is operably coupled to the first receiver 810 in order to coordinate the receipt of indication 815 and 830. Apparatus 800 also includes a determiner 835 of another unique bar-coded ID number 840 of a second PCBA, in which the second PCBA includes a failed component of the plurality of substantially similar components. The determiner 835 cross-references the indication of a failure 815 and the PCBA ID 820, the indication of a failed PCBA component 830, and a manufactured PCBA database (DB) 842. The manufactured PCBA database (DB) 842 stores information including the ID of PCBAs and the ID of the plurality of substantially similar components that were used in the manufacture of the PCBAs. The determiner 835 is operably coupled to receiver 825. Apparatus 800 also includes a communicator 845 of the second unique bar-coded ID number 840 to an entity 850 associated with possession of the second PCBA. The communicator 845 is operably coupled to the determiner 835. In another embodiment, apparatus 800 also includes a determiner 855 of a causation 860 of the failure of the first PCBA. The causation is associated with a source selected from the group consisting of a vendor of the failed component, a manufacturer of the failed component, and a process of manufacturing the PCBA. The second determiner 855 is operably coupled to the first determiner 835.

In varying embodiments, apparatus 800 includes a first capturer 865 of a bar-coded ID of the plurality of substantially similar components (such as a bar-code scanner), a second capturer 870 (such as a bar-code scanner) of the first unique bar-coded ID number of the first PCBA and the second unique bar-coded ID number of the second PCBA, a determiner 875 of an association of the bar-coded ID of the plurality of substantially similar components with the first unique bar-coded ID number of the first PCBA, and/or a determiner 880 of the bar-coded ID of the plurality of substantially similar components with the second unique bar-coded ID number of the second PCBA.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

We claim:

1. A computerized method for tracking individual components consumed during production of printed circuit board assemblies, the method comprising:

(a) capturing a component identification of a selected component from a plurality of components, the component identification associated with an original equipment manufacturer's source identifier for the component;

(b) capturing a unique board identification of a selected printed circuit board from a plurality of printed circuit boards;

(c) observing an attaching of the selected component to the selected printed circuit board;

(d) determining a printed circuit board assembly identification associating the use of the selected component with the selected printed circuit board for subsequently tracking the selected component, and (e) identifying the selected printed circuit board from the determining step (d) in response to another circuit board comprising a component from the plurality of components and indicating a possible component failure.

2. The computerized method of claim 1, wherein the capturing step (b) is performed before the capturing step (a).

3. The computerized method of claim 1, wherein the plurality of components comprises a reel of components.

4. The computerized method of claim 1, wherein the method further comprises:

(e) determining a causation of the failure of the other printed circuit board, the causation being associated with a source identifier selected from a group consisting of a vendor error and a manufacturer error.

5. The computerized method of claim 1, wherein the determining step (d) further comprises:

(d) (1) determining a plurality of printed circuit board assembly identifications associated with a commensurate number of printed circuit boards of the plurality of printed circuit boards; and wherein the identifying step (e) further comprises:

(e)(1) communicating the plurality of printed circuit board assembly identifications to at least one entity associated with possession of the commensurate number of printed circuit boards.

6. The computerized method of claim 5, wherein an entity associated with possession further comprises a downstream member of a marketing channel.

7. The computerized method of claim 1:

wherein the capturing step (a) and the capturing step (b) and the determining step (d) are performed during a production of the selected printed circuit board and the identifying step (e) is performed during a production of the other printed circuit board.

8. The computerized method of claim 1 wherein the source identifier comprises a trace code of the plurality of components, a lot code of the plurality of components, a vendor of the plurality of components, a production date, a date after which the printed circuit board is produced, and a date before which the printed circuit board is produced.

9. The computerized method of claim 1 wherein the capturing step (a) further comprises:

(a)(1) scanning a bar code of a reel of components.

10. The computerized method of claim 1 wherein the other printed circuit board is produced after the selected printed circuit board.

11. A computerized apparatus for tracking components consumed during production of printed circuit board assemblies, the apparatus comprising:
- a first capturer of a unique board identification of a selected printed circuit board from a plurality of printed circuit boards;
- a second capturer of a component identification of a selected component from a plurality of components, the component identification associated with an original equipment manufacturer's source identifier for the component;
- a determiner of a printed circuit board assembly identification associating the use of the selected component with the selected printed circuit board for subsequently tracking the selected component, and;
- an identifier of the selected printed circuit board responsive to the determiner and another printed circuit board comprising a component from the plurality of components and indicating a possible component failure.

12. The computerized apparatus of claim 11, wherein the plurality of components comprises a reel of components.

13. The computerized apparatus of claim 11, wherein the apparatus further comprises:
- a second determiner of a causation of the failure of the other printed circuit board, the causation being associated with a source identifier selected from a group consisting of a vendor error and a manufacturer error.

14. The computerized apparatus of claim 11 wherein the source identifier comprises a trace code of the plurality of components, a lot code of the plurality of components, a vendor of the plurality of components, a production date, a date after which the printed circuit board is produced, and a date before which the printed circuit board is produced.

15. The computerized apparatus of claim 11 wherein the second capturer further comprises a scanner of a bar code of a reel of components.

16. The computerized apparatus of claim 11, wherein the determiner
- associates a plurality of printed circuit board assembly identifications commensurate with the plurality of printed circuit boards.

17. The computerized apparatus of claim 16, wherein the identifier communicates the plurality of printed circuit board assembly identifications to at least one entity associated with possession of the commensurate number of printed circuit boards.

18. The computerized apparatus of claim 11, wherein the identifier further comprises:
- communicator of the plurality of printed circuit board assembly identifications to at least one entity associated with possession of the commensurate number of printed circuit boards.

19. A system for tracking failed components in printed circuit board assemblies comprising:
- a processor;
- a storage device coupled to the processor;
- means determining a printed circuit board assembly identification associating the use of a selected component, from a plurality of components, with a selected printed circuit board, from a plurality of printed circuit boards, by capturing a component identification of the selected component associated with an original equipment manufacturer's source identifier, and by capturing a unique circuit board identification.

\* \* \* \* \*